United States Patent [19]
Burns et al.

[11] Patent Number: 5,118,299
[45] Date of Patent: Jun. 2, 1992

[54] CONE ELECTRICAL CONTACT

[75] Inventors: Francis C. Burns, Apalachin; John J. Kaufman, Windsor; David E. King, Endicott; Alan D. Knight, Newark Valley, all of N.Y.

[73] Assignee: International Business Machines Corporation, Armonk, N.Y.

[21] Appl. No.: 520,335

[22] Filed: May 7, 1990

[51] Int. Cl.$^5$ .............................................. H01R 9/00
[52] U.S. Cl. ...................................... 439/74; 439/290
[58] Field of Search ................... 200/279; 439/55, 78, 439/74, 284, 285, 290, 291, 931; 29/830, 837, 846, 884, 885, 877; 361/406, 412

[56] References Cited

U.S. PATENT DOCUMENTS

| | | | |
|---|---|---|---|
| 3,344,316 | 9/1967 | Stelmak | 439/72 |
| 3,346,350 | 10/1967 | Spooner | 219/118 |
| 3,634,807 | 1/1972 | Grobe et al. | 339/17 |
| 3,725,845 | 3/1973 | Moulin | 339/49 |
| 3,881,799 | 5/1975 | Elliott et al. | 339/252 |
| 4,050,756 | 9/1977 | Moore | 339/59 |
| 4,074,112 | 2/1978 | Runft | 200/279 |
| 4,100,856 | 7/1978 | Ziemba | 29/884 |
| 4,116,517 | 9/1978 | Selvin et al. | 439/329 |
| 4,240,198 | 12/1980 | Alonso | 29/876 |
| 4,254,431 | 3/1981 | Babuka | 357/82 |
| 4,254,431 | 3/1981 | Babuka et al. | 357/82 |
| 4,328,410 | 5/1982 | Slivinsky et al. | 219/121 |
| 4,508,749 | 4/1985 | Brannon et al. | 427/43.1 |
| 4,604,644 | 8/1986 | Beckham et al. | 357/80 |
| 4,644,130 | 2/1987 | Bachmann et al. | 219/121 |
| 4,751,563 | 6/1988 | Liabowitz et al. | 357/71 |
| 4,813,129 | 3/1989 | Karnezos | 361/406 |
| 4,892,487 | 1/1990 | Dranchak et al. | 439/630 |
| 4,976,626 | 12/1990 | Dibble et al. | 439/78 |

FOREIGN PATENT DOCUMENTS

| | | |
|---|---|---|
| 1121011 | 3/1982 | Canada . |
| 0347561 | 12/1989 | European Pat. Off. . |
| 2816328 | 10/1978 | Fed. Rep. of Germany . |
| 1170621 | 1/1959 | France ......... 439/289 |
| 52-73394 | 6/1977 | Japan ............ 439/290 |
| 1568464 | 5/1980 | United Kingdom . |

OTHER PUBLICATIONS

Nuclear Instruments and Methods in Physics Research, B13 (1986) pp. 309-312, "Development of Microcones Induced by Contamination Lithography", by Linders et al.

Appl. Phys. Lett. 49(8), Aug., 1986, "Development and Origin of Conical Structures on XeCl Laser Ablated Polyimide" by Dyer et al.

Appl. Phys. Lett. 52(22), May 1988, "Novel Method for Measuring Excimer Laser Ablation thresholds of Polymers" by Dyer et al.

Research Disclosure, Jan., 1988, No. 285, "Doped Polyimide Etching by Laser Ablation" by Chuang et al.

Research Disclosure, Mar., 1988, No. 287, "Method to Provide Multiple Dendritic Contact Points for High Density Flat on Flat Connector System", by Desai et al.

(List continued on next page.)

*Primary Examiner*—Neil Abrams
*Attorney, Agent, or Firm*—Judith D. Olsen

[57] ABSTRACT

An electrical interconnection, which includes a method for fabricating the device, is disclosed. The interconnection comprises two contact surfaces, on at least one of which is disposed at least one conical projection in predetermined dimension and location. Rather than being permanently cojoined, the contact surfaces are attachable and detachable when desired. The individual conical projections are comprised of an ablative material, and at least some of the conical projections include a surface which is substantially comprised of material in a thickness capable of making ohmic contact, either by wiping with an intermeshing like structure or by contacting a substantially flat contact pad. An interconnection, in this invention, is the combination of at least one contact having individual conical projections and another contact, optionally having individual conical projections. The conical projections are formed by laser. The conical projections are optionally formed on the head of a contact pin.

13 Claims, 9 Drawing Sheets

OTHER PUBLICATIONS

Technical Disclosure Bulletion vol. 22, No. 7, Dec., 1979, "Liquid Metal/Dendrite Connector" by Babuka et al.

Technical Disclosure Bulletion vol. 23, No. 8, Jan., 1981, "Dendrite Connector System with Reinforced Base" by Armstrong.

Technical Disclosure Bulletin vol. 24, No. 1A, Jun. 1981, "Process for Producing Palladium Structures" by Armstrong et al.

Technical Disclosure Bulletion vol. 30, No. 11, Apr., 1988, "Removal of Debris Left by Ablative Photodecomposition of Polymers" by Braren et al.

J. Apply. Phys. 64(1), Jul., 1988, "Structural Origin of Surface Morphological Modifications Developed on Poly(ethylene terephthalate) by Excimer Laser Photoablation" by Novis et al.

J. Appl. Phys. 64(5), Sep., 1988, "The effect of debris formation on the morphology of excimer laser ablated polymers", by Taylor et al.

SE IMAGE
35° TILT

FIG.12a

380X
MAGNIFICATION

SE IMAGE
35° TILT

FIG.12b

100X
MAGNIFICATION

FIG.13

CONE ELECTRICAL CONTACT

BACKGROUND OF THE INVENTION

The present invention relates to an electrical interconnection and means of making the interconnections, which are useful in electronic packaging applications such as in semiconductor integrated circuit chips and circuit boards and cards, cables and modules.

Recent developments in integrated circuits have clearly demonstrated the benefits which can be achieved by fabricating electrical devices into smaller and smaller packages. These small packages are densely packed, being multilevel with signal and power planes and other features on various levels and means of interconnecting selected levels to one another. The interconnections themselves provide sites for potential signal degradation. For example, interconnections between levels of conductor lines, and between conductor lines of a printed circuit board (PCB) or card and any electrical devices mounted thereon can be made between conductive areas called pads. Impedance matching, minimum number of discontinuities and redundancy must be present at these interconnections in order to permit rapid, low noise, low loss, low resistance signal transmission. Approaches used at present in devising interconnections for these electronic packages require several photolithographic masking and etching steps, and the attachment of surface mounted devices may require soldering and rework, often involving exposing the components to destructive temperature cycling.

Electrical interconnections comprised of interdigitated dendritic projections are a fertile field of scientific inquiry. The conical projections of the present invention are distinguished from dendritic projections by the method of making, by composition, by the controlled location and dimensions of conical projections. Schemes proposed to strengthen dendrites, such as coating with soft metal are described in IBM TDB Vol. 22, No. 7, p. 2706 by Babuka et al. and copending application Ser. No. 07/415,435 to Cuomo et al., filed Sep. 28, 1989 and commonly assigned with the present invention.

IBM Technical Disclosure Bulletin Vol. 22, No. 7, p. 2706, published December, 1979 by Babuka et al. describes a high density pad-to-pad connector on which dendrites are grown on a pad and coated with a liquid gallium alloy. When the dendritic pad is mated, the dendrites pierce the tarnished liquid metal film of a second pad and make the electrical contact.

IBM Technical Disclosure Bulletin, Vol. 24, No. 1A, June, 1981, p. 2, "Process For Producing Palladium Structures" by Armstrong et al. describes that the small cross-section of the base of the dendrite is at least partly to blame for breakage of dendrites. It also describes the need for "wipe" to make low resistance contact, but states that the roughness of the dendritic surfaces provides sufficient wipe.

IBM Technical Disclosure Bulletin, Vol. 23, No. 8, January, 1981, p. 1, "Dendrite Connector System With Reinforced Base" by Armstrong agrees with the above diagnosis, but differs in the proposed cure, proposing instead reflowing tin around the bases of the dendrites. Dendrites as pad-to-pad contact elements are also described in *Research Disclosure*, March, 1988, No. 287, p. 28748, "Method to Provide Multiple Dendritic Contact Points for High Density Flat on Flat Connector System", disclosed anonymously. Again, the dendrites, described are irregularly shaped and randomly located. However, the reduced connector length of the dendrites are described as providing noise reduction and improved signal speed, and the references suggests that having multiple contact points lowers contact resistance.

Other means in the art of making electrical interconnection between contact pads include spheres (U.S. Pat. No. 3,634,807 issued Jan. 11, 1972 to Grobe et al., U.S. Pat. No. 4,604,644 issued Aug. 5, 1986 to Beckham et al.) conductive rods (U.S. Pat. No. 4,644,130 issued Feb. 17, 1987 to Bachmann, U.S. Pat. No. 4,050,756 issued Sep. 27, 1977 to Moore, and U.S. Pat. No. 4,240,198, issued Dec. 23, 1980 to Alonso), hollow posts (U.S. Pat. No. 3,725,845) and third structures interposed between and parallel to the connector pads but separate from both (U.S. Pat. Nos. 3,881,799, issued May 6, 1975 to Elliott et al. and 3,634,807, issued Jan. 11, 1972 to Grobe et al.).

Flat-topped protrusions, permanently connecting pads between levels in a multilayer structure are described in the art (U.S. Pat. No. 4,751,563, issued Jun. 14, 1988 to Laibowitz et al.).

U.S. Pat. No. 3,634,807, issued Jan. 11, 1972 to Grobe et al. describes a removably attachable contact comprising a plurality of hollow metal spheres or wire balls mounted in a predetermined pattern on either side of a flexible insulating sheet. Alternatively, metal is deposited in openings at the intersection of thin strips of insulating material. In another embodiment, a conductive sheet is sandwiched between sets of contact elements. These embodiments are designed to be relatively inflexible in the X-Y direction and flexible in the Z direction. These structures are inadequate for high packing density structures, being of dimensions which are too large and too vulnerable to dirt contamination.

U.S. Pat. No. 3,725,845 issued Apr. 3, 1975 to Moulin describes a hermaphroditic connector comprising a plurality of hollow posts. This is a large scale connector for watertight use with cables in geophysical surveying, rather than for use with microminiature contact pads in packaging.

U.S. Pat. No. 3,881,799 issued May 6, 1975 to Elliott et al. describes a connector that comprises a plurality of domes projecting from both sides of a spring matrix, interposing a third element between the contacts to be connected, the third element is integral to neither.

U.S. Pat. No. 4,644,130 issued Feb. 17, 1987 to Bachmann describes a plurality of elastomeric connector rods which have been rendered conductive by being filled with conductive particles dispersed therein.

U.S. Pat. No. 4,751,563 issued Jun. 14, 1988 to Laibowitz et al. describes a method of making a cone shaped structure, having a carbonaceous surface contaminant, using an electron beam. A conductive layer is deposited on at least a portion of the cone and over the substrate area around the base of the cone. Then an insulating material is applied overall and any further processing is performed. Structures described in this patent are in the nature of through-holes, buried irreversibly within a unitary multilayer structure rather than being removably attached. Since electron beam radiation is used, the material from which the cone is comprised must be photoactive with respect to electron beams.

Unlike connectors described in the art, the connector of the present invention is reproducible, substantially smooth, of a single preselected height and non-brittle and applicable to interconnection of high density circuitry.

Independent of the electrical connection art, it is known that polyimide, along with certain other polymers, is removable by laser radiation (U.S. Pat. Nos. 4,328,410 issued May 4, 1982 to Slivinsky et al., 4,508,749 issued Apr. 2, 1985 to Brannon et al., and Research Disclosure, January, 1988, No. 285, p. 28,569, disclosed anonymously), and that irregular conical formations can inadvertently be obtained by laser ablation of a polyimide, ("Development and Origin of Conical Structures on XeCl Laser Ablated Polyimide", App. Phys. Letter 49(8), Aug. 25, 1986, pp. 453–455 by Dyer et al.). In the latter reference, cones were only formed in laser ablation of polyimide when impurities were present in the polyimide either unintentionally or were deliberately added as a "seed" of particulate impurities.

The Slivinsky et al. patent describes the removal of polyimide from a metallic substrate with lateral and depth precision and without causing damage to the metallic substrate. It further describes polyimide removal by a $CO_2$ laser in the infrared region. Removal of polyimide by a $CO_2$ laser in the infrared region proceeds by a mechanism different from ablation by excimer laser, such as in the present invention, which occurs in the ultraviolet region. Excimer lasers include XeCl, KrF, ArF and XeF lasers.

An improvement to the laser ablation rate of polyimide and other polymers by adding dye is described in Research Disclosure, January 1988, No. 285, p. 28,569, "Doped Polyimide Etching By Laser Ablation", disclosed anonymously. IBM TDB Vol. 30, No. 11, April 1988, p. 191, "Removal of Debris Left By Ablative Photodecomposition Of Polymers" by Braren et al. describes several ways to remove any debris that may be generated when polyimide or other polymer is removed by laser.

U.S. Pat. No. 4,508,749 to Brannon et al., commonly assigned with the present invention, describes the laser ablation of polyimide through a mask, exposing openings having sloped walls. The Brannon et al. patent is incorporated herein by reference for its description of excimer laser ablation of polyimide.

"Novel Method for Measuring Excimer Laser Ablation Thresholds of Polymers" by Dyer et al., published in App. Phys. Lett. 52 (22) May 30, 1988, pp. 1880–1882 describes control of morphological features, including cones, on laser ablated polyimide and other polymers which have, unlike the present invention, been "seeded". In neither of the Dyer et al. references is an electrical interconnection suggested or implied. "Structural Origin of Surface Morphological Modification Developed on Poly(ethylene terephthalate) (PET) by Excimer Laser Photoablation" by Novis et al., published in J. Appl. Phys. 64(1), Jul. 1, 1988, pp. 365–370 also describes seeding and ablation by XeCl lasers. However, the formation of cones in PI and PET during laser ablation is attributed to redeposition of debris, mostly carbon, in "The Effect of Debris Formation on the Morphology of Excimer Laser Ablated Polymers" by Taylor et al. in J. App. Phys. 64(5) Sep. 1, 1988, pp. 2815–2818.

In each of these journal publications, the formation of cones is regarded as undesirable, a phenomenon to be avoided.

Some processes used in fabricating electronic interconnections use chlorofluorocarbons (CFC's). Thus, it is one object of the invention to use laser mask technology rather than photolithography.

It is a further object of the invention to provide the capability to interconnect high density packages of electrically mounted devices and PCBs and/or cards to each other and to cables.

It is a further object of the invention to provide an electrical interconnection which permits reliable, rapid, dirt tolerant, low noise, low loss, low resistance signal transmission.

It is still a further object of the invention to provide a method of making the electrical interconnection described above in an efficient and controllable manner.

It is therefore an object of this invention to provide a conical electrical interconnection useful in the art of electronic packaging.

It is a further object of the invention to provide a conical, low resistance electrical interconnection which has a measure of flexibility and is nondestructively connectable and disconnectable.

Still another object of the invention is to provide a fabrication method to produce an electrical interconnection between two contact surfaces, at least one of which comprises essentially perpendicular conical projections of predetermined pattern and dimensions.

These and other objects, features and advantages of the present invention will become more apparent from the descriptions to follow.

SUMMARY OF THE INVENTION

The electrical interconnection of the present invention comprises a first and a second contact surface, at least one of which includes a conductive substrate having conical conductors extending substantially perpendicularly therefrom. The conical conductors comprise a core of polymeric material, as described more fully hereinbelow, having a conductive film thereover.

The polymeric cones are formed in a laser removable polymer material which is disposed in a thickness predetermined to be equal to the desired height of conical projections to be formed. The contact further includes, in electrical contact with the first conductive surface, a substantially electrically continuous conductive material deposited on at least some of the cones, which have been formed in a predetermined pattern by selectively removing polymeric material by laser.

The conical projections are formed by excimer laser removal of polymer material through a mask of patterned dots. The dots are opaque to the laser beam. The laser beam is projected through the mask, removing polymer from areas not blocked by the dots. The arrangement of dots on the mask predetermines the location of the conical projections in the polymer. A second conductive surface is optionally also provided with conical projections designed to wipe and intermesh with those on the first conductive surface and prepared in the same manner. The conductive cones extending substantially perpendicularly from their respective conductive substrate, contacted together form the interconnection, which provides contact while being freely attachable and detachable as desired.

In a double-sided embodiment, wherein conical projections disposed on a first conductive substrate are brought into interdigitated contact with like conical projections similarly disposed on a second conductive substrate, the respective spacing of the conical projections is such that there is mutual "wipe" between contacting conical projections without their breakage, while at the same time surface contaminants are displaced from the conical projections.

Contact is further facilitated by the shaping of the top of each of the conical projections, which are sharply domed, and by the fact that in operation a typical conical projection is in contact with four nearest neighbor cones.

In a single-sided embodiment, conductive conical projections, disposed on only a first conductive surface, are brought into contact with a second conductive surface, forming the electrical interconnection. The tips of the conical projections are brought into contact with enough force to displace any contaminants which may be present on the second conductive surface.

Alternatively, in a pin-type conical interconnection, a second conductive surface may, instead of contact pads alone, include conductive through-holes or blind vias, within which contact is made by a connector pin. The pin is optionally soldered in place. Then the conical projections, which are disposed on the head of the pin, are brought into contact with a first conductive surface.

The conical projections are essentially perpendicular in relation to their respective conductive surface. The height of the cones is selected in part to be sufficient for any contaminant or dust to reside therebetween when displaced such that the resistance of the interconnection to be formed is not elevated thereby.

DESCRIPTION OF THE DRAWINGS

FIG. 12, a and b, shows an SEM of the result of applying excess contact force between the cone array surface of a single sided cone connector and the flat contact pad surface.

DESCRIPTION OF THE PREFERRED EMBODIMENTS

The array of conical projections comprises polymeric conical bodies formed by excimer laser etching or ablation (removal) and having a conductive layer thereon.

Figure 1:
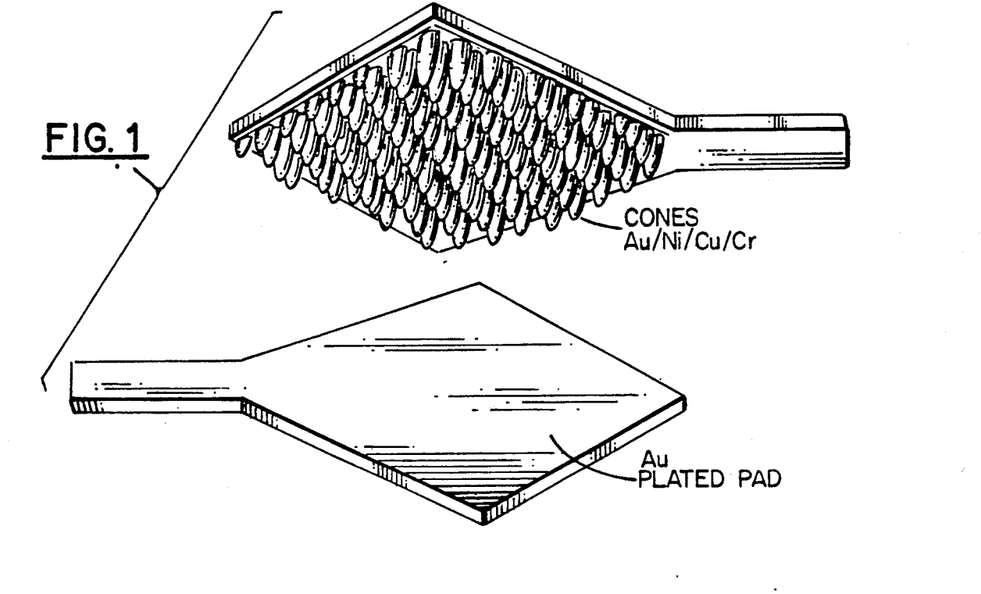
FIG. 1 shows one embodiment of a single sided cone connector which, in combination with a substantially planar connector, comprises a single sided conical pad-to-pad interconnection.

FIG. 1 represents one embodiment of a single sided conical pad-to-pad interconnection. The array of conical projections is comprised of polyimide, followed by an adhesion layer of Cr, followed by a conductive layer of one or more of Cu, Ni and Au, for example a first inner conductive layer of Cu, an intermediate conductive layer of Ni and an outer conductive layer of Au.

Figure 2:
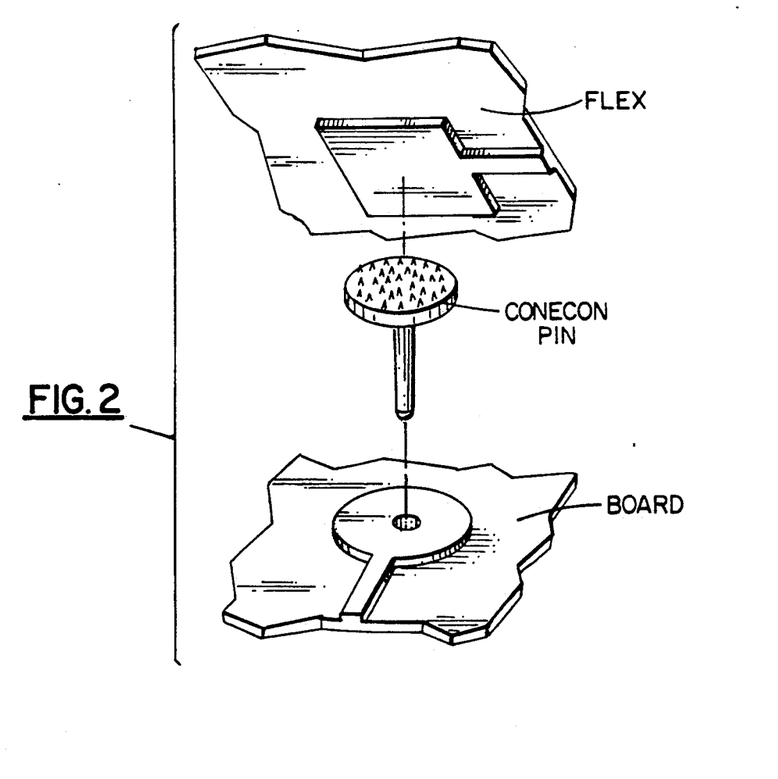
FIG. 2 shows another embodiment of the single sided cone connector, a pin-type referred to as a conecon.

The FIG. 2 drawing shows the conical connector in relation to a through-hole in a pad on the circuit board and a contact pad in a flexible circuit card with which it is designed to interconnect.

The cones of the connector are provided on the head of a connector pin and fit into and make ohmic contact with a first conductive surface at a contact pad. The pin end of the connector pin makes ohmic contact with a metallized through hole of a printed circuit board.

Figure 3:
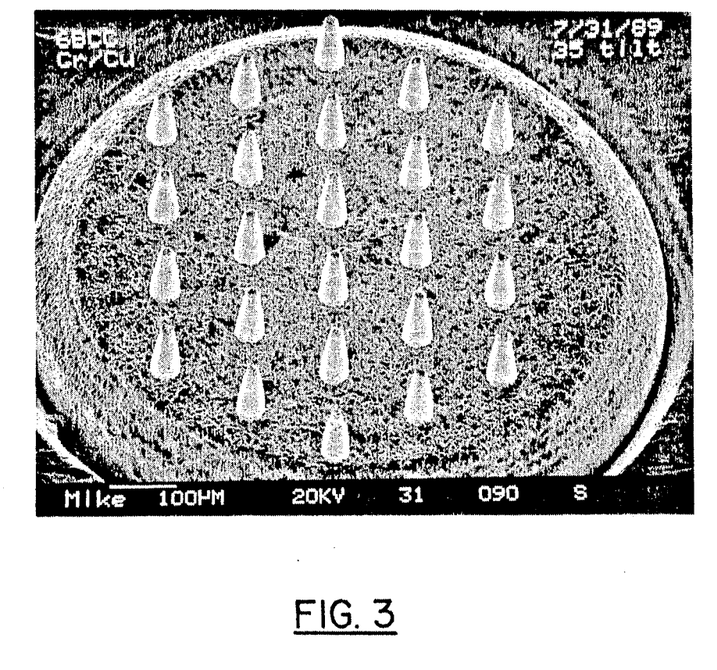
FIG. 3 shows a scanning electron micrograph (SEM) at 85 degree tilt of an array of the conical projections of the pin-type embodiment of the present invention after laser ablation but prior to metallization. The scale is on the photograph.

Referring to FIG. 3, a connector pin is shown with an array of conical projections on the pin head. In typical operation as an electrical interconnection, the pin end is brought into contact with a conductive through-hole or blind via and is soldered in place. The conical projections are brought into contact with a second conductive surface, completing the interconnection.

Figures 4, 5, 6:
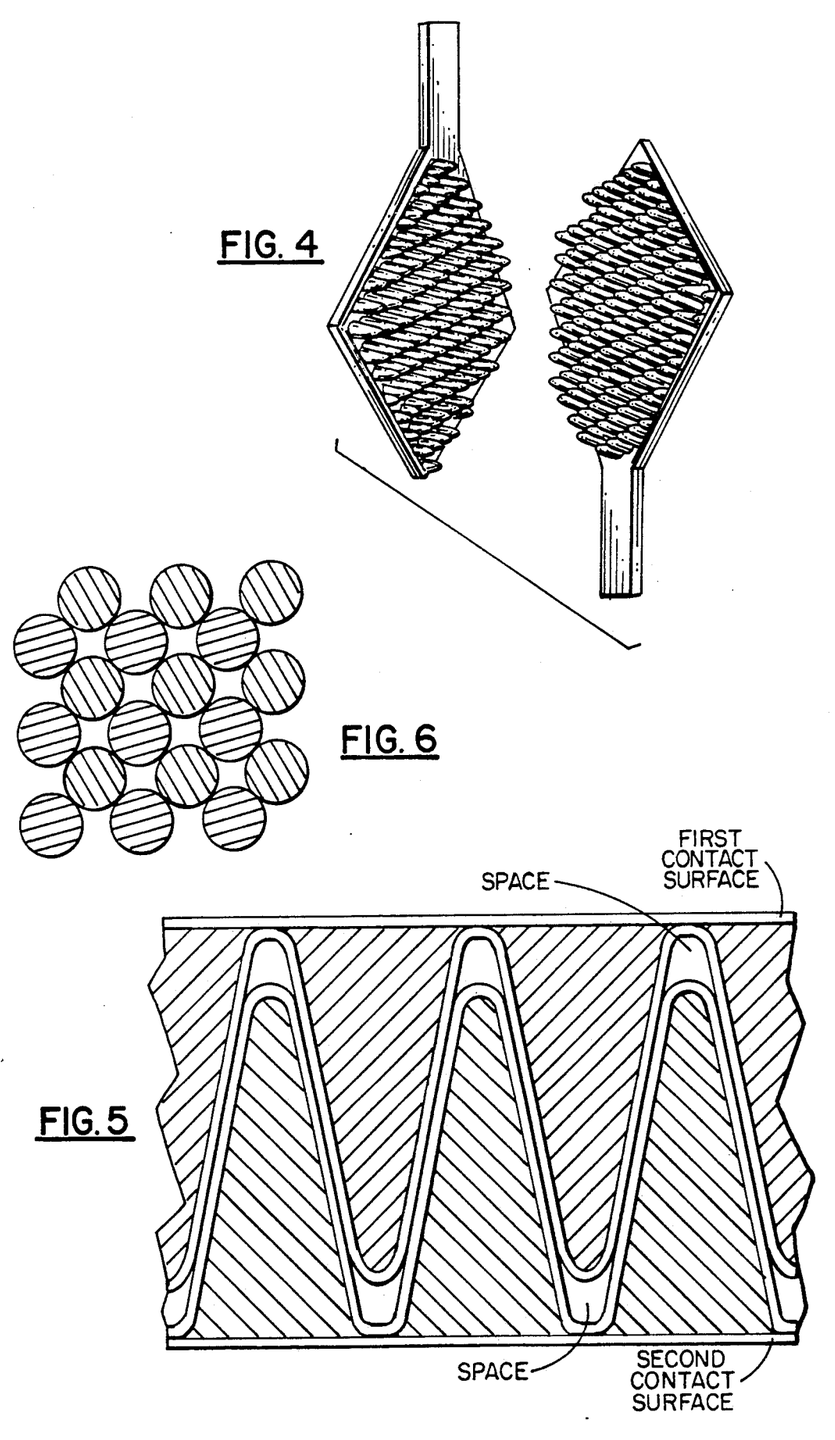
FIG. 4 shows an embodiment of a pad-on-pad double sided cone connector.
FIG. 5 shows a cross section parallel to the cone axis of the cone connector of FIG. 4 during interconnection.
FIG. 6 shows a cross section of the FIG. 5 interconnection, perpendicular to the cone axis.

FIG. 4 shows two cone contacts in spaced apart relationship. When the two cone contacts of FIG. 4 are brought together, each conical projection wipes on its nearest neighbor, displacing dirt. The dirt may comprise ambient dust or a chemical film.

The FIGS. 5 and 6 drawings demonstrate the intimacy of contact achievable with a double sided cone interconnection. As the first and second contact surfaces approach each other, the cones wipe against each other, displacing contaminants.

Figure 7:
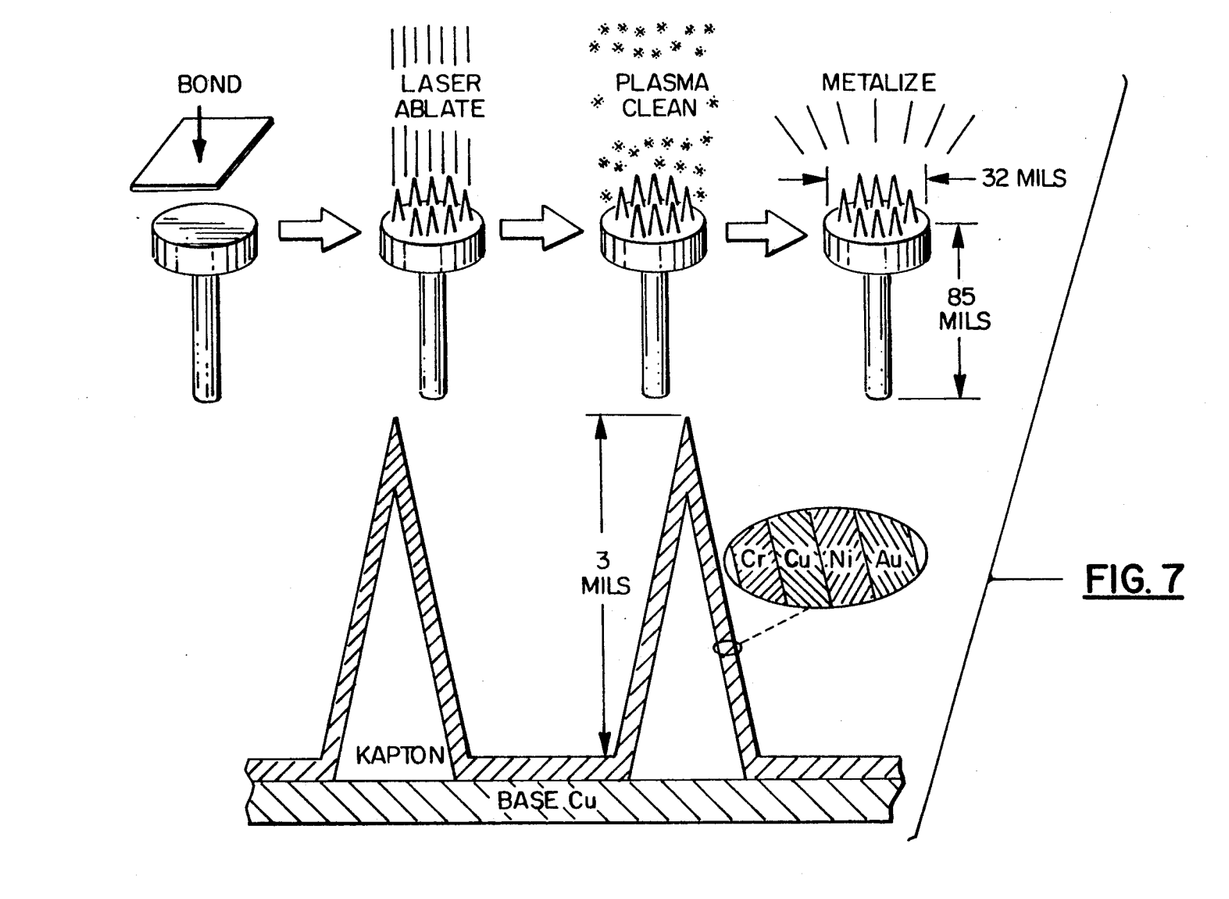
FIG. 7 shows schematically the step in the process of making the connector shown in FIG. 3.

The flow chart of FIG. 7 depicts the process of making a conecon of the invention made by the method described in the Examples. As shown in the Figure, a film of polyimide, which is obtainable in dry sheets in various thicknesses, is bonded to a brass connector pin which, as illustrated, is 85 mils long. The polyimide film is laser ablated through a projection mask of dots to form an array of polyimide cones on the head part of the connector pin. The array thus formed is subjected to plasma etching to remove polyimide debris left behind from the laser ablation, followed by an overall metallization of conductive material selected from a group which will adhere both to the polyimide cones and to the exposed brass of the substrate therebetween.

Figure 8:
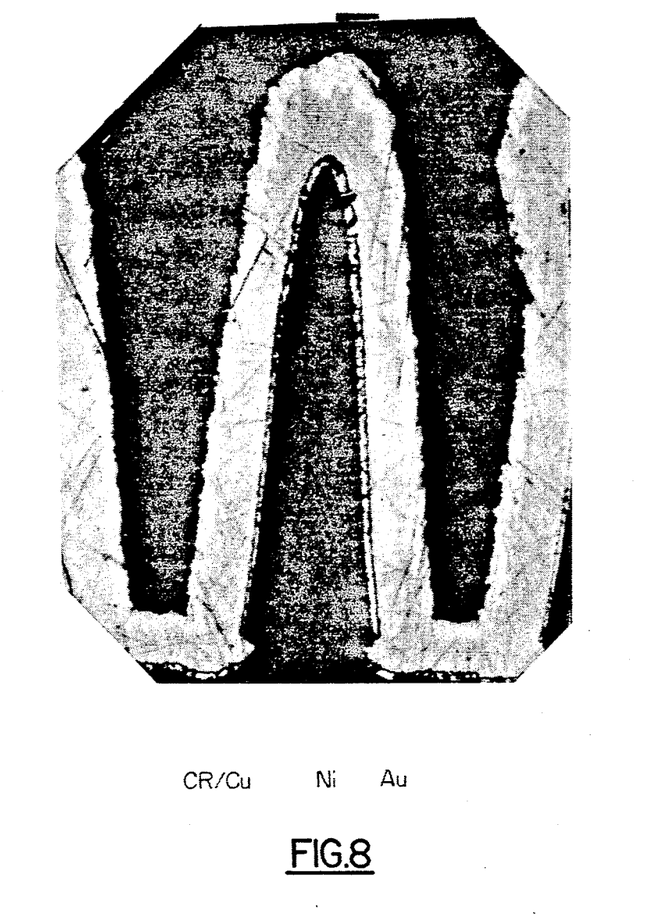
FIG. 8 shows a magnified cross sectional view of an actual cone in an array prepared as described above for FIG. 7.

The resulting polyimide conical projections are shown in the FIG. 8 cross-sectional photograph. Typical polyimide cones are 3 mils high and have a high aspect ratio. The chromium adhesion layer is too thin to be seen, but the copper-nickel-gold can be discerned and is uniformly deposited along the topography of the cone. The spacing and height of cones are defined by the dirt expected to contaminate the surface of the cones. The smaller the size and quantity of dirt expected, the smaller and denser can be the conical projections in order to maintain a low contact resistance. It is clear that cones from about 2 to about 6 mils can be made easily. Heights should be sufficient to permit contamination to reside between cones without interfering with low resistance. Generally, the smaller the contaminant particles expected, the shorter can be the height of the cones.

Figure 9A:
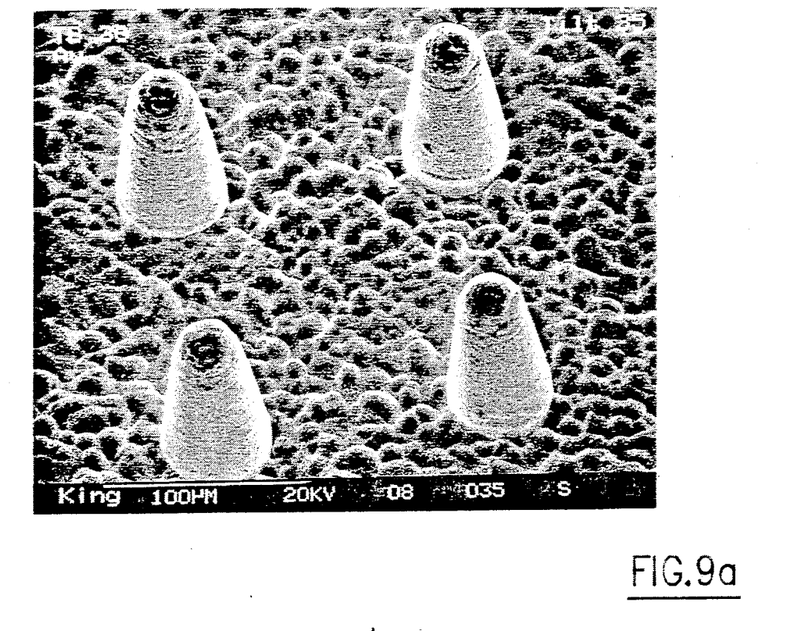
FIG. 9a shows, after metallization, an SEM of one region of a cone array prepared by the method of the invention. Tilt is 35 degrees; the scale is on the photograph.
Figure 9B:
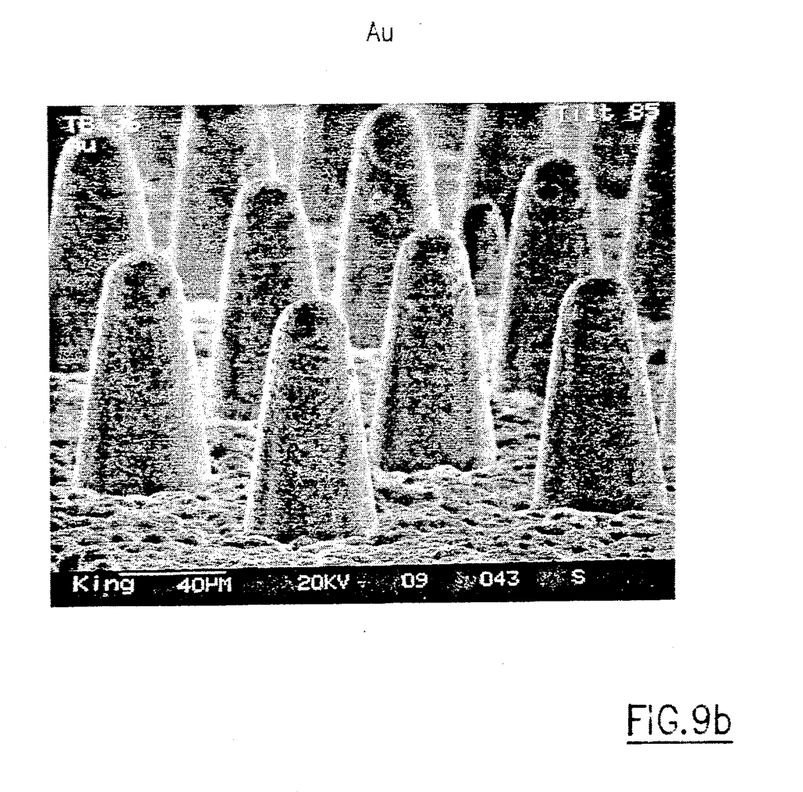
FIG. 9b shows, after metallization, an SEM of one region of a cone array prepared by the method of the invention. Tilt is 85 degrees; the scale is on the photograph.

FIG. 9a and FIG. 9b show the uniformity of size and the shape of the conical projections. The spacing between cones is seen to be controlled, and the tops uniformly shaped after plating. The top radius of the cones is ½ mil.

Figure 10:
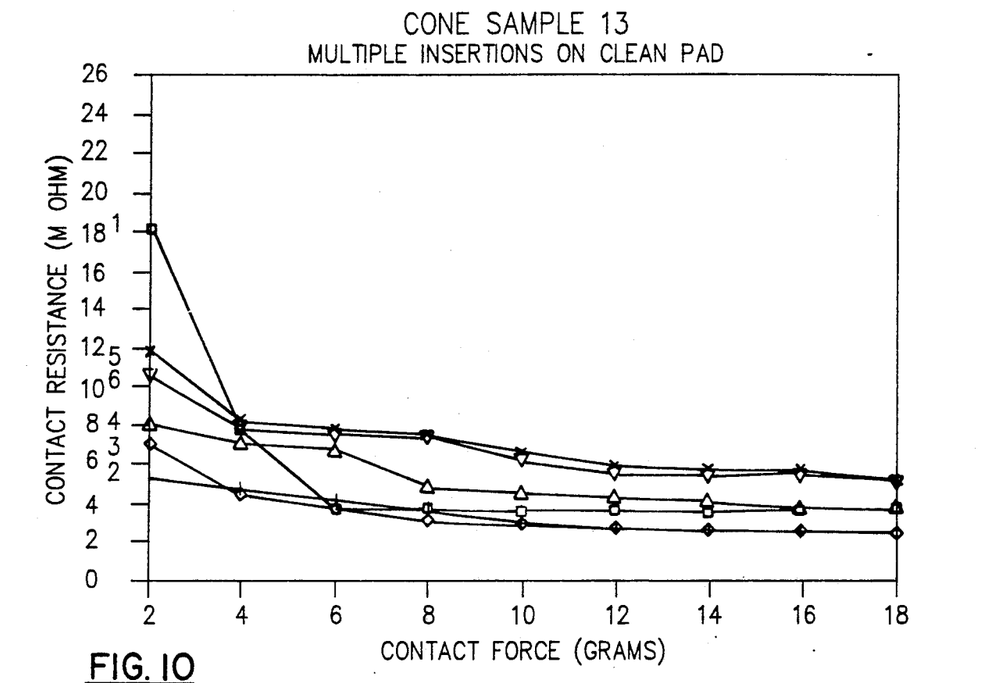
FIG. 10 shows the contact resistance in milliohms of the single sided cone connector as a function of contact force.

The graph of FIG. 10 illustrates that the contact resistance is stable at and above a contact force of about 10 grams. Each line represents a separate incidence of contact between the conical projections on a first contact surface with the contact pad which comprises a second contact surface and is an indication of the level of reproducibility of the contact resistance. Up to 300 contact cycles of up to 20 grams of force have been performed with reproducible contact resistance. Cones have been subjected to greater than about 200 grams of force without sustaining damage.

Figure 11:
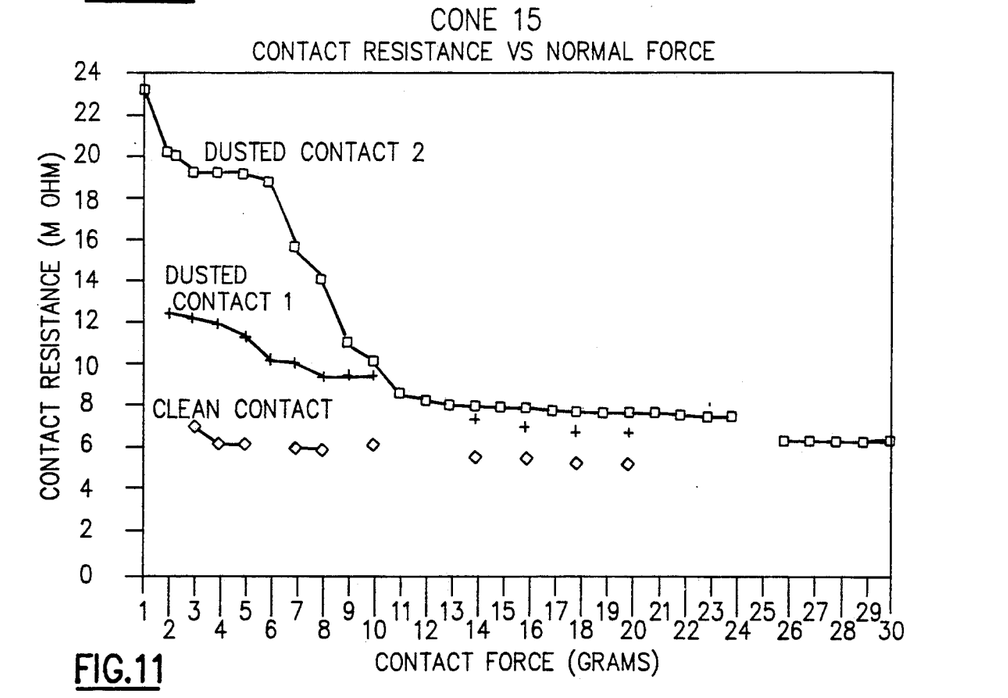
FIG. 11 shows a comparison of the contact resistance in milliohms of a single sided cone connector as a function of contact force when there is dirt present compared to a clean contact.

FIG. 11 shows dusted contact 1 exposed to a moderate application of sieved simulated dust, which incorporates particles up to about 3 mils. Dusted contact 2 was exposed to a redusting of the same dust in an extremely heavy amount. No attempt was made to quantify the amount of dust. The graph shows that a minimum normal contact force of about 14 grams was needed to overcome the effect of the dust contamination on the contact resistance, and that the amount of force required to produce similar contact resistance was practically independent of the amount of dust. Experiments were also performed using "gray dust", a heterogenous representation of particles and of synthetic fibers such as to be found in carpeted industrial installations. Mean diameter of the fibers was about 2.5 mils.

Figure 12A:
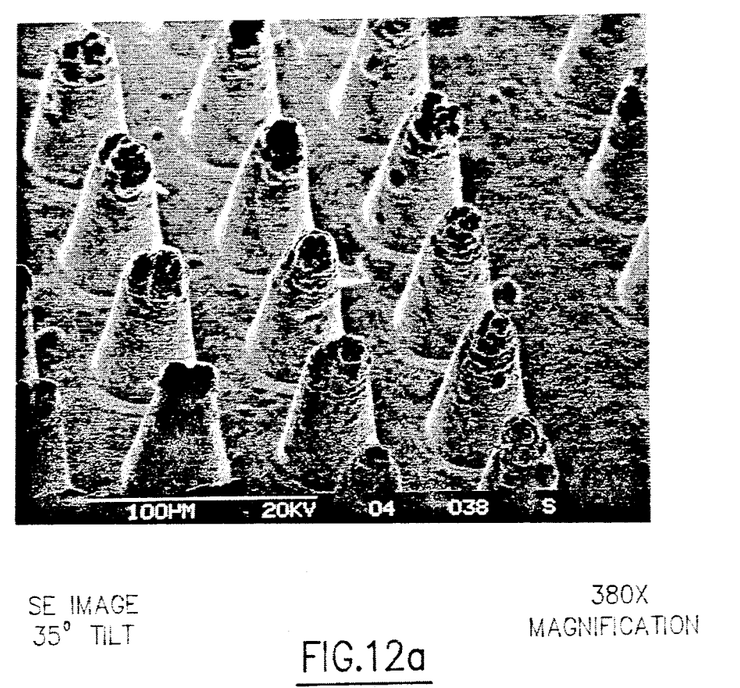
Figure 12B:
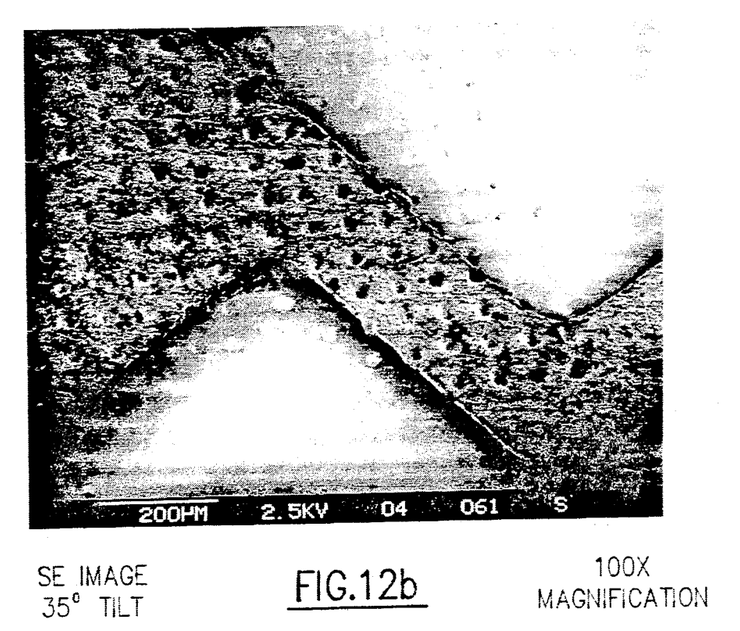

As seen in FIGS. 12a and 12b, the worst damage to cones subjected to an amount of force greater than 200 grams appears to be a flattening of the rounded tops of some of the cones, even though the flat contact pad can be seen to be extensively punctured by the cones. It is evident from these SEMs that the cones are strong without being brittle, despite a high aspect ratio.

Figure 13:
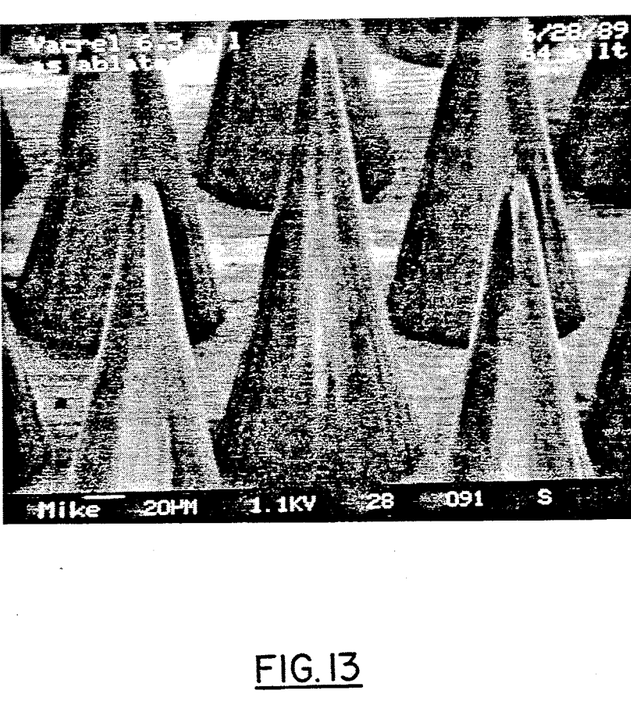
FIG. 13 shows an SEM of an array before metallization of laser ablated cones. The cones are 6.5 mils high, tilt is 64 degrees.

The conical projections of FIG. 13 have been laser ablated, but not yet metallized, in a layer of Vacrel which is 6.5 mils thick. Vacrel is a trademark of E. I. du Pont de Nemours and Company for a dry photopolymer film.

It should also be noted in general that the narrower the tips of the cones, the better the contact that can be made. However, the broader the base, the more resistant are the cones expected to be to Z (lateral) forces.

EXAMPLE 1

An interconnect having pin-type conical interconnection ("conecon") has been prepared by the following method:

1. Etching and Loading

A brass connector pin ("conecon blank") was placed in a holder made of Teflon, polytetrafluorethylene, (a registered trademark of E.I. Dupont de Nemours & Co.), selected for its inertness and designed to hold the pin by the stem.

A cleaning solution consisting of approximately two tablespoons of Sparkleen in 500 ml. deionized (DI) water was prepared (Sparkleen is a trademark of Fisher Scientific). Sparkleen is a sodium phosphate based laboratory glassware detergent. The polytetrafluoroethylene holder and conecon blanks were immersed in the Sparkleen detergent solution for 30 minutes with vigorous stirring, then removed and rinsed in flowing DI water for one minute and rinsed twice more in a beaker of DI water. The rinse was intended to be as thorough as possible, and other rinsing protocols are expected to be equally effective.

The conecon blanks were transferred to a Buchner funnel having a fritted disk, washed twice with 100 ml DI water, washed twice with 50 ml methanol and once with acetone. The purpose of the methanol was to remove the DI water. A wide variety of other solvents having high vapor pressure and water solubility could be used equally successfully to remove the water.

The conecon blanks were dried under flowing nitrogen gas, then loaded into a second polytetrafluoroethylene holder designed so that the heads of the conecon blanks would be nearly flush with the top surface of the holder.

The conecon blanks and the second polytetrafluoroethylene holder were placed in a deaerated, approximately 6 molar HCl solution. The HCl solution was maintained under a blanket of nitrogen gas while the conecon blanks were etching in the HCl solution under vigorous stirring. The 6 M HCl concentration is not critical, but was chosen because the etch was completed at room temperature in a reasonable time at that concentration.

After 24 hours the etched conecon blanks and second polytetrafluorethylene holder were removed from the HCl solution and placed in an approximately 2 molar nitric acid solution for 5 minutes, with stirring. The time and concentration of $HNO_3$ are not critical having been chosen to dissolve copper oxide in a reasonable time. The etched conecon blanks and second polytetrafluoroethylene holder were washed under flowing DI water for one minute, then submersed in flowing DI water for one minute.

The etched and rinsed conecon blanks were mechanically wiped, transferred to a Buchner funnel with fritted disk and washed as follows to remove residual metal salts, organics and acids, and to assist in drying: (a) three times with 50 ml deionized DI H2O; (b) twice with 50 ml methanol; and (c) twice with 50 ml acetone. The conditions of this rinse cycle are intended to be sufficient to remove all water.

The etched conecons were then dried in flowing N2.

2. Fixture Loading

The dried conecon blanks were manually loaded into the processing fixture to hold them for further processing.

3. Lamination of Polyimide (PI) Film to Conecon Blanks

PI film was laminated onto the head of the conecon in a thickness sufficient to obtain the cone height desired, which for this test was 3 mils. The type of PI used, Kapton, was treated with an adhesive to bond between PI and the brass connector pin. The adhesive used was Flex-i-mid, a trademark of Rogers Corporation, Rogers, CT. The PI was hot pressed to the head of the conecon blank in a tool press at 540 degrees F., for 2 minutes at 50 psi followed by 10 minutes more at 500 psi, and allowed to cool for 40 minutes at a rate of 5 degrees F./minute. The press was removed and the PI was postbaked for 30 minutes at 400 degrees F., plus 30 minutes at 500 degrees F., plus 30 minutes at 600 degrees F. It will be obvious to one skilled in the art that the polymer, in addition to being applied as dry film, may be provided in solution form and may be applied by spinning, spraying or dipping followed by at least partial cure or solidification as is conventional depending on the particular polyimide and the desired height of the cones.

3. Laser Formation of Cones

The excimer laser optics were cleaned and aligned. Any projection system which creates an image through a mask and increases fluence on a target could be used. However, in the present case a −0.25X telecentric doublet was used as a projection lens. The mask used was Chromium on quartz, comprising an array of Cr dots on a clear background, surrounded by blanket Cr. However, any mask opaque to the laser and not damaged thereby would work as well. The focal plane of the system was found by using a fluorescing photoresist. The conecon fixture with Flex-i-mid adhered polyimide laminate conecons was placed on its mount and the optical elements moved so that image plane and PI surface coincided. A selected conecon was aligned to the mask and the PI was ablated to produce cones. The fixture was stepped to the next conecon and the process repeated in series until all the conecons were laser etched. Polymer was simultaneously removed by the laser from the portions of the contact between the cones.

The cones thus produced were smooth, with sloped walls, and all were of a height of about 4 mils, base diameter of about 1 mil as ablated. The tops were pointed and domed.

Typical parameters used in forming the cones were as follows:

Wavelength: 308 nm; (any excimer wavelength is expected to work)
Pulse width: 40 ns; (any typical excimer laser output is expected to work)
Repetition rate: about 5 to about 50 Hz; (any typical excimer laser repetition rate is expected to work)
Number of pulses: about 275 to about 350; and
Fluence: about 600 to about 950 mJ/cm2. (The lower the fluence, the greater the number of pulses needed to form the cones.)

4. Plasma Cleaning

Next the debris left behind from the laser ablation of the polyimide was plasma cleaned in an LFE 1002 barrel reactor chamber. The system was warmed up and parts were loaded. The chamber was pumped down and the gas mixture was bled into the chamber. In this particular case, the gas mixture comprised by volume about 27% CF4, 68% O2 and 5% N2. The power, rate of gas flow and pressure level were optimized for the system and the parts were treated until clean.

5. Cr/Cu Sputter Deposition

The conecon parts were sputter cleaned in a plasma chamber in order to promote better adhesion. The conecon parts were preheated with infrared lamps to raise their temperature and promote outgassing before the metallization, thereby further improving adhesion. 150 Angstroms of chromium for adhesion followed by 40,000 Angstroms of copper were applied to the ablated cones using a Leybold Z600 sputtering system.

At the end of the sputtering process, the parts were allowed to cool under nitrogen for about 10 minutes and then removed.

6. Nickel/Gold Plating

The conecons were deoxidized in a dilute solution of sulfuric acid, rinsed in DI water and plated in an electroless nickel solution. Approximately 0.2 mils of electroless nickel was applied to the conecon The nickel plated conecons were rinsed in DI water, then rinsed in dilute H2SO4 and DI water rinsed again. The nickel plating was followed by an overplate of 0.1 mils pulse electroplated cobalt hardened gold. The object was DC pulse plated in the hardened gold solution according to the following cycle:
Time on: 3 ms
Time off: 27 ms
Peak current: 0.15 amp.
Plating time: 60 min.;
These plating conditions were chosen in order to obtain a more uniform gold deposit.

It will be recognized by one skilled in the art that these plating baths are widely available commercially.

The gold plated conecons were then rinsed to remove cyanate ions using tapwater, and were forced air dried.

A substantially similar process has been used to prepare the single sided pad-to-pad cone connector represented in FIG. 2 and the double sided pad-to-pad conical interconnection described herein as an alternate embodiment.

EXAMPLE 2

The details of the procedure used were substantially similar to that described in Example 1.

1. Copper contact pads were used as the conductive surfaces.

2. Sodium chlorite solution was applied to the contact pads in order to promote adhesion.

3. Vacrel 8030 photoresist was laminated to the substrate on which the contact pads were present. (Vacrel 8030 is an aqueous based photo resist.)

4. Normal photolithography steps were performed in order to leave Vacrel only on the contact pads.

5. Laser etching through a projection mask was performed in order to produce conical projections in the Vacrel.

6. A chrome adhesion layer, and a copper layer were sputtered over the cones, followed by electroless nickel and hard gold electroplate.

If desired, a low temperature solder can be plated, such as prior to electroless nickel, and can be reflowed in order to improve the lateral strength of the cones by about a factor of two. Lateral strength is important in order for the cones to withstand differential thermal expansion.

The cone connectors of the invention were exposed to Instron testing in a Model 1125 and 4-point probe resistance measurement in order to ascertain the ability of the cone connectors to withstand the repeated contact cycling and to determine the effect of dust, contact pressure and the number of cones making contact. The SEMs were obtained using a Cambridge Instruments S250 Mark II scanning electron microscope.

We claim:

1. A contact for use between microcircuits in PCB devices, comprising a conductive surface and a plurality of sharply domed, substantially conical projections of predetermined dimensions protruding therefrom and integral therewith in predetermined location each of said plurality of projections being sufficiently rigid to penetrate any contaminant film or debris on a mating conductive surface, and each having a polymer core and a substantially electrically continuous conductive surface in electrical communication with the conductive surface from which they protrude, having also a domed end for making contact.

2. The contact recited in claim 1, wherein the polymer core comprises laser removable polymer.

3. The contact recited in claim 1, wherein the conductive surface from which the projections protrude is a contact pin head.

4. The contact recited in claim 1, wherein the conductive surface from which the projections protrude is a contact pad of a printed circuit device.

5. The contact recited in claim 2 wherein the laser removeable polymer comprises an excimer laser removeable polymer.

6. The contact recited in claim 2, wherein the laser removeable polymer comprises a polyimide.

7. An electrical interconnection for use in directly connecting microcircuits in PCB devices, comprising:
   a first conductive surface electrically integral to a first microcircuit;
   a plurality of sharply domed, metal coated, polymeric, substantially conical projections of predetermined location and dimension integral with each other and with the first conductive surface from which they protrude, the projections being sufficiently rigid to penetrate any containment film or debris on a second conductive surface;
   a substantially electrically continuous conductive surface on the polymeric projections and on at least a portion of said first conductive surface exposed thereabout; and
   a second conductive surface for making direct electrical contact with the first conductive surface and electrically integral to a second microcircuit.

8. The interconnection recited in claim 7, wherein the substantially continuous conductive surface on the projections comprises at least one layer of metal selected from the group consisting of copper, gold, chromium, tin, lead, nickel, rhodium, palladium, and alloys and mixtures thereof.

9. The interconnection recited in claim 7, wherein the projections comprise a metal coated, excimer laser removeable polymer.

10. The interconnection recited in claim 9, wherein the excimer laser removeable polymer comprises a polyimide.

11. An electrical interconnection for use in directly connecting microcircuits in PCB devices, comprising:
    a first and a second mutually detachable and attachable surface for electrical contact, each of which includes:
    a substantially flat contact pad;
    a plurality of sharply domed polymeric, substantially conical projections of predetermined location and dimension integral with each other and with the contact pad from which they protrude substantially perpendicularly in predetermined dimension and location; and
    a substantially electrically continuous conductive surface on the polymeric, substantially conical projection in electrical communication with the exposed contact pad from which they protrude.

12. The interconnection recited in claim 11, wherein the conical projections included on the first vertically detachable surface display substantially separate and individual deflection in response to engagement with the second vertically detachable electrical contact.

13. The contact or electrical interconnection recited in claims, 1, 7 or 11 wherein the projections are about 2 mils to about 6.5 mils high, have a top radius of curvature of about ¼mil to about ½mil, and a base diameter of about 1 to about 2 mils.

* * * * *